United States Patent
Tay et al.

(10) Patent No.: US 9,252,075 B2
(45) Date of Patent: Feb. 2, 2016

(54) SEMICONDUCTOR DEVICE AND METHOD OF FORMING A CONDUCTIVE VIA-IN-VIA STRUCTURE

(75) Inventors: Lionel Chien Hui Tay, Singapore (SG); Jianmin Fang, Singapore (SG); Zigmund R. Camacho, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 315 days.

(21) Appl. No.: 13/604,539

(22) Filed: Sep. 5, 2012

(65) Prior Publication Data
US 2012/0326329 A1 Dec. 27, 2012

Related U.S. Application Data

(62) Division of application No. 12/332,318, filed on Dec. 10, 2008, now Pat. No. 8,283,250.

(51) Int. Cl.
*H01L 23/48* (2006.01)
*H01L 21/768* (2006.01)

(52) U.S. Cl.
CPC ........ *H01L 23/481* (2013.01); *H01L 21/76898* (2013.01); *H01L 2224/16225* (2013.01); *H01L 2224/48091* (2013.01); *H01L 2224/48247* (2013.01); *H01L 2224/73265* (2013.01); *H01L 2924/13091* (2013.01); *H01L 2924/15311* (2013.01)

(58) Field of Classification Search
CPC ........... H01L 2924/01078–2924/01079; H01L 2924/01029; H01L 2924/01013; H01L 23/5226; H01L 23/481
USPC .......................................... 257/773–776, 758
See application file for complete search history.

(56) References Cited

U.S. PATENT DOCUMENTS

| | | | |
|---|---|---|---|
| 6,686,662 B2 | 2/2004 | Merchant et al. | |
| 6,878,572 B2 | 4/2005 | Nair | |
| 7,282,802 B2 | 10/2007 | Clevenger et al. | |
| 7,378,342 B2 | 5/2008 | Kirby et al. | |
| 2005/0212126 A1* | 9/2005 | Sunohara | 257/730 |
| 2010/0013068 A1* | 1/2010 | Huang et al. | 257/676 |
| 2010/0096708 A1* | 4/2010 | Eckstein | 257/414 |

* cited by examiner

*Primary Examiner* — Hoa B Trinh
(74) *Attorney, Agent, or Firm* — Robert D. Atkins; Patent Law Group: Atkins and Associates, P.C.

(57) ABSTRACT

A semiconductor device is made from a semiconductor wafer containing semiconductor die separated by a peripheral region. A conductive via-in-via structure is formed in the peripheral region or through an active region of the device to provide additional tensile strength. The conductive via-in-via structure includes an inner conductive via and outer conductive via separated by insulating material. A middle conductive via can be formed between the inner and outer conductive vias. The inner conductive via has a first cross-sectional area adjacent to a first surface of the semiconductor device and a second cross-sectional area adjacent to a second surface of the semiconductor device. The outer conductive via has a first cross-sectional area adjacent to the first surface of the semiconductor device and a second cross-sectional area adjacent to the second surface of the semiconductor device. The first cross-sectional area is different from the second cross-sectional area.

30 Claims, 8 Drawing Sheets

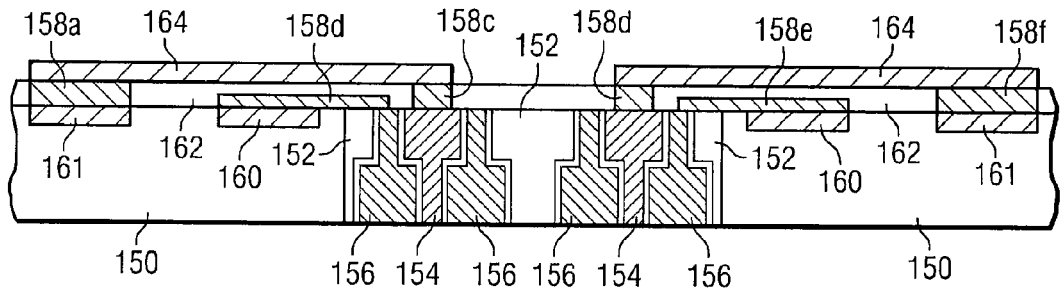
FIG. 5
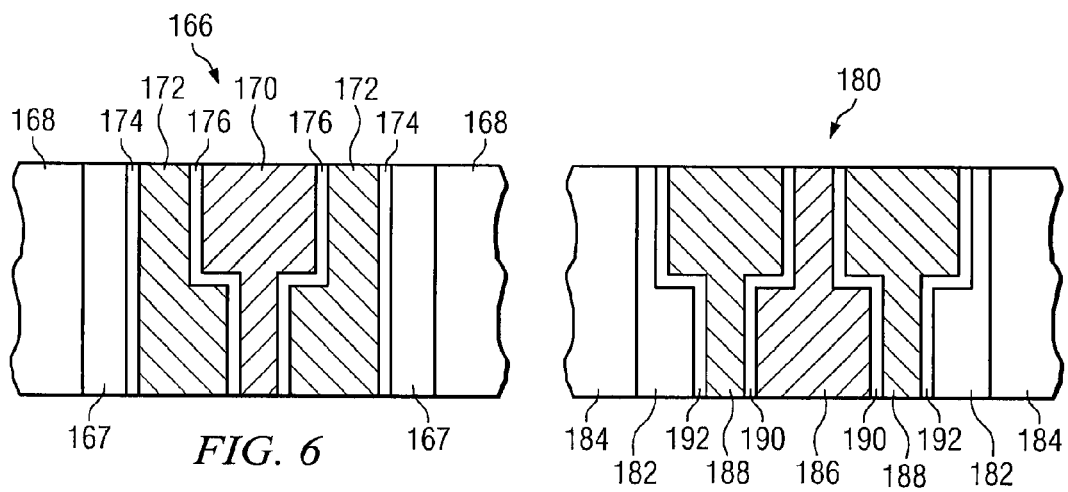
FIG. 6
FIG. 7
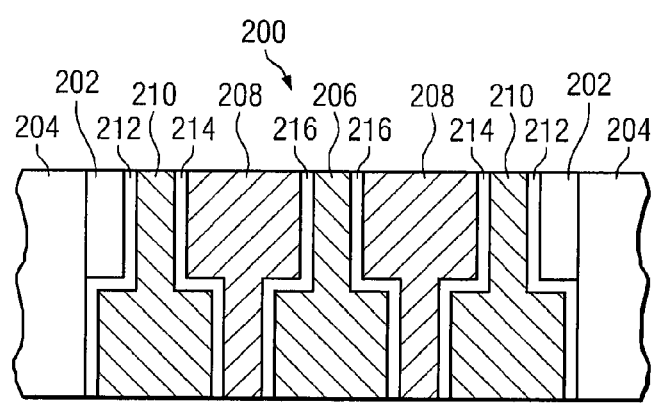
FIG. 8

SEMICONDUCTOR DEVICE AND METHOD OF FORMING A CONDUCTIVE VIA-IN-VIA STRUCTURE

CLAIM TO DOMESTIC PRIORITY

The present application is a division of U.S. patent application Ser. No. 12/332,318, now U.S. Pat. No. 8,283,250, filed Dec. 10, 2008, which application is incorporated herein by reference.

FIELD OF THE INVENTION

The present invention relates in general to semiconductor devices and, more particularly, to a semiconductor device and method of forming a conductive via-in-via structure.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power generation, networks, computers, and consumer products. Semiconductor devices are also found in electronic products including military, aviation, automotive, industrial controllers, and office equipment.

Semiconductor devices exploit the electrical properties of semiconductor materials. The atomic structure of semiconductor material allows its electrical conductivity to be manipulated by the application of an electric field or through the process of doping. Doping introduces impurities into the semiconductor material to manipulate and control the conductivity of the semiconductor device.

A semiconductor device contains active and passive electrical structures. Active structures, including transistors, control the flow of electrical current. By varying levels of doping and application of an electric field, the transistor either promotes or restricts the flow of electrical current. Passive structures, including resistors, diodes, and inductors, create a relationship between voltage and current necessary to perform a variety of electrical functions. The passive and active structures are electrically connected to form logic circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

Semiconductor devices are usually interconnected with substrates and other devices using bond wires, solder bumps, through hole vias (THV), and through silicon vias (TSV). The THVs and TSVs are typically formed as holes with straight sidewalls filled with conductive material. The straight-sidewall TSV and THV structures have limited tensile strength and can exhibit open circuit or higher joint resistance during reliability testing. For example, the THVs and TSVs can fatigue during high temperature and thermal cycling.

SUMMARY OF THE INVENTION

A need exists for THVs and TSVs in a semiconductor device with greater tensile strength and less susceptibility to fatigue during reliability testing. In one embodiment, the present invention is a semiconductor device comprising a semiconductor wafer including a plurality of semiconductor die separated by a peripheral region. A conductive via-in-via structure is formed in the peripheral region. The conductive via-in-via structure includes an inner conductive via and outer conductive via separated by insulating material with vertical and lateral portions. The conductive via-in-via structure extends from a first surface of the peripheral region to a second surface of the peripheral region opposite the first surface of the peripheral region.

In another embodiment, the present invention is a semiconductor device comprising a semiconductor die and conductive via-in-via structure formed in a peripheral region of the semiconductor die. The conductive via-in-via structure includes an inner conductive via and outer conductive via separated by insulating material with a first cross-sectional area of the inner conductive via and outer conductive via being different than a second cross-sectional area of the inner conductive via and outer conductive via.

In another embodiment, the present invention is a semiconductor device comprising a semiconductor die and conductive via-in-via structure formed in the semiconductor die. The conductive via-in-via structure includes an inner conductive via and outer conductive via separated by insulating material with a first cross-sectional area of the inner conductive via and outer conductive via being different than a second cross-sectional area of the inner conductive via and outer conductive via.

In another embodiment, the present invention is a semiconductor device comprising an inner conductive via formed in the semiconductor device and insulating material formed around the inner conductive via. An outer conductive via is formed around the insulating material with a first cross-sectional area of the inner conductive via and outer conductive via being different than a second cross-sectional area of the inner conductive via and outer conductive via.

BRIEF DESCRIPTION OF THE DRAWINGS

FIG. 5 illustrates a process of forming side-by-side conductive via-in-via structures in a peripheral region of the semiconductor die;

FIG. 6 illustrates a first conductive via-in-via structure with horizontal and vertical insulating material;

FIG. 7 illustrates a second conductive via-in-via structure with horizontal and vertical insulating material;

FIG. 8 illustrates a third conductive via-in-via structure with horizontal and vertical insulating material.

DETAILED DESCRIPTION OF THE DRAWINGS

Figure 1:
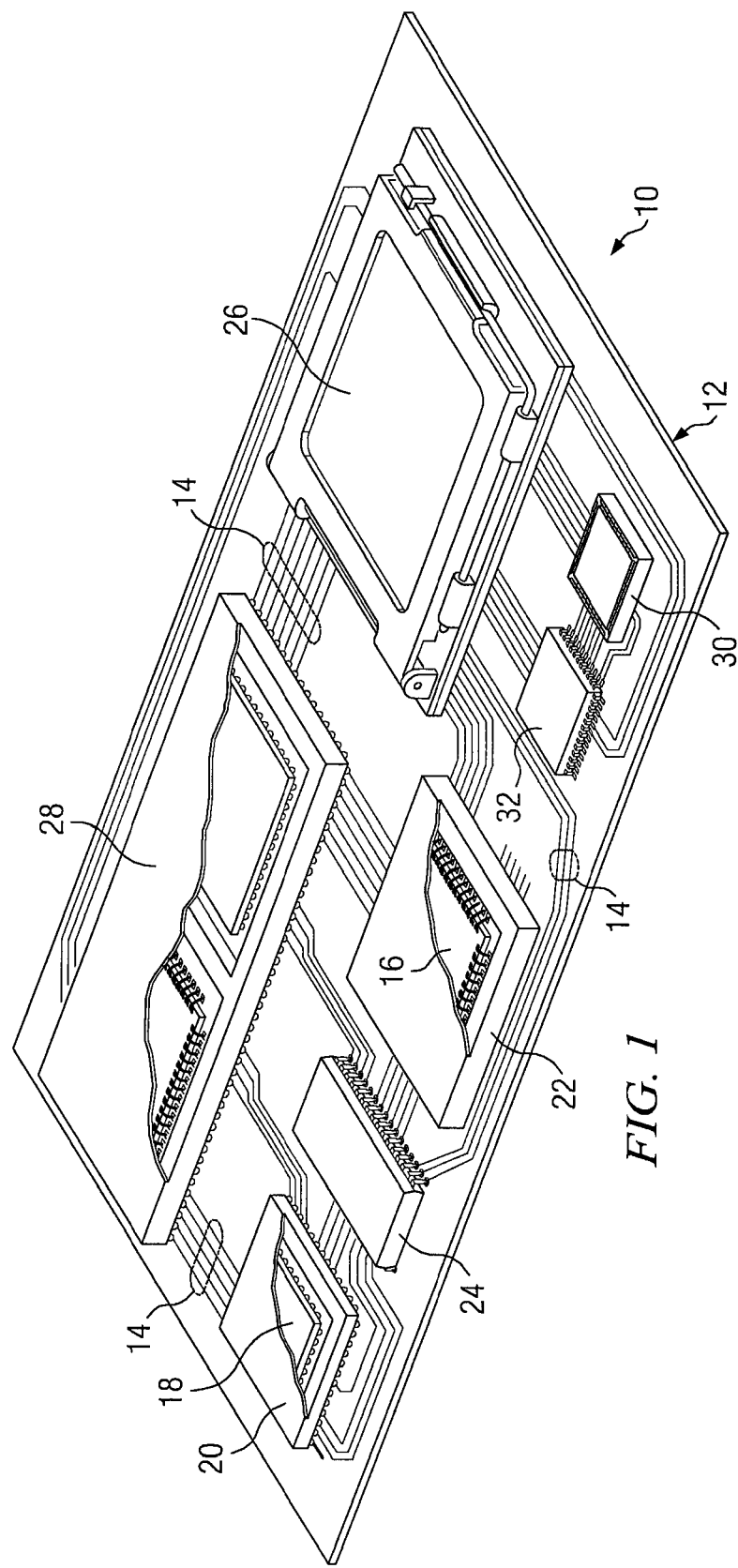
FIG. 1 illustrates a printed circuit board (PCB) with different types of packages mounted to its surface.

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors, have the ability to control the flow of electrical current. Passive electrical components, such as capacitors, inductors, resistors, and transformers, create a relationship between voltage and current necessary to perform electrical circuit functions.

Passive and active components are formed on the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into a permanent insulator, permanent conductor, or changing the way the semiconductor material changes in conductivity in response to an electric field. Transistors contain regions of varying types and degrees of doping arranged as necessary to enable the transistor to promote or restrict the flow of electrical current upon the application of an electric field.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting device or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 10 having a chip carrier substrate or printed circuit board (PCB) 12 with a plurality of semiconductor packages mounted on its surface. Electronic device 10 may have one type of semiconductor package, or multiple types of semiconductor packages, depending on the application. The different types of semiconductor packages are shown in FIG. 1 for purposes of illustration.

Electronic device 10 may be a stand-alone system that uses the semiconductor packages to perform an electrical function. Alternatively, electronic device 10 may be a subcomponent of a larger system. For example, electronic device 10 may be a graphics card, network interface card, or other signal processing card that can be inserted into a computer. The semiconductor package can include microprocessors, memories, application specific integrated circuits (ASICs), logic circuits, analog circuits, RF circuits, discrete devices, or other semiconductor die or electrical components.

In FIG. 1, PCB 12 provides a general substrate for structural support and electrical interconnect of the semiconductor packages mounted on the PCB. Conductive signal traces 14 are formed on a surface or within layers of PCB 12 using evaporation, electrolytic plating, electroless plating, screen printing, PVD, or other suitable metal deposition process. Signal traces 14 provide for electrical communication between each of the semiconductor packages, mounted components, and other external system components. Traces 14 also provide power and ground connections to each of the semiconductor packages.

In some embodiments, a semiconductor device has two packaging levels. First level packaging is a technique for mechanically and electrically attaching the semiconductor die to a carrier. Second level packaging involves mechanically and electrically attaching the carrier to the PCB. In other embodiments, a semiconductor device may only have the first level packaging where the die is mechanically and electrically mounted directly to the PCB.

For the purpose of illustration, several types of first level packaging, including wire bond package 16 and flip chip 18, are shown on PCB 12. Additionally, several types of second level packaging, including ball grid array (BGA) 20, bump chip carrier (BCC) 22, dual in-line package (DIP) 24, land grid array (LGA) 26, multi-chip module (MCM) 28, quad flat non-leaded package (QFN) 30, and quad flat package 32, are shown mounted on PCB 12. Depending upon the system requirements, any combination of semiconductor packages, configured with any combination of first and second level packaging styles, as well as other electronic components, can be connected to PCB 12. In some embodiments, electronic device 10 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a shorter manufacturing process. The resulting devices are less likely to fail and less expensive to manufacture resulting in lower costs for consumers.

Figure 2A:
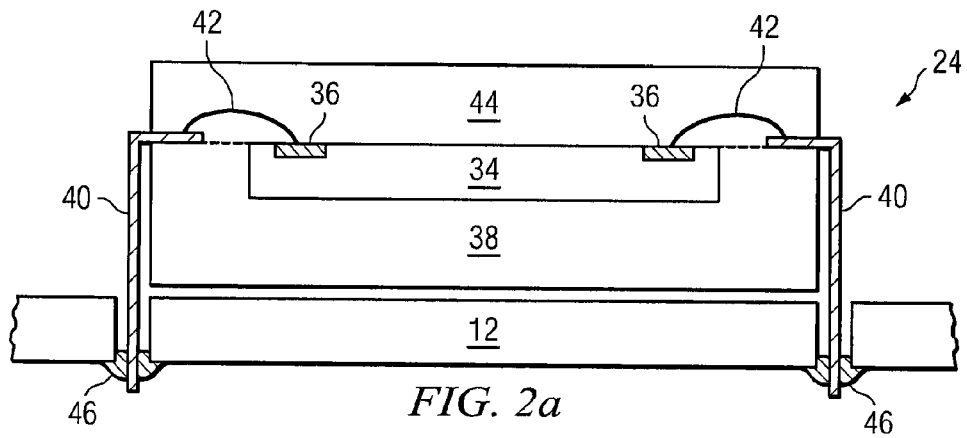
FIGS. 2a-2c illustrate further detail of the representative semiconductor packages mounted to the PCB.

FIG. 2a illustrates further detail of DIP 24 mounted on PCB 12. DIP 24 includes semiconductor die 34 having contact pads 36. Semiconductor die 34 includes an active region containing analog or digital circuits implemented as active devices, passive devices, conductive layers, and dielectric layers formed within semiconductor die 34 and are electrically interconnected according to the electrical design of the die. For example, the circuit may include one or more transistors, diodes, inductors, capacitors, resistors, and other circuit elements formed within the active region of die 34. Contact pads 36 are made with a conductive material, such as aluminum (Al), copper (Cu), tin (Sn), nickel (Ni), gold (Au), or silver (Ag), and are electrically connected to the circuit elements formed within die 34. Contact pads 36 are formed by PVD, CVD, electrolytic plating, or electroless plating process. During assembly of DIP 24, semiconductor die 34 is mounted to a carrier 38 using a gold-silicon eutectic layer or adhesive material such as thermal epoxy. The package body includes an insulative packaging material such as polymer or ceramic. Conductor leads 40 are connected to carrier 38 and wire bonds 42 are formed between leads 40 and contact pads 36 of die 34 as a first level packaging. Encapsulant 44 is deposited over the package for environmental protection by preventing moisture and particles from entering the package and contaminating die 34, contact pads 36, or wire bonds 42. DIP 24 is connected to PCB 12 by inserting leads 40 into holes formed through PCB 12. Solder material 46 is flowed around leads 40 and into the holes to physically and electrically connect DIP 24 to PCB 12. Solder material 46 can be any metal or electrically conductive material, e.g., Sn, lead (Pb), Au, Ag, Cu, zinc (Zn), bismuthinite (Bi), and alloys thereof, with an optional flux material. For example, the solder material can be eutectic Sn/Pb, high-lead, or lead-free.

Figure 2B:
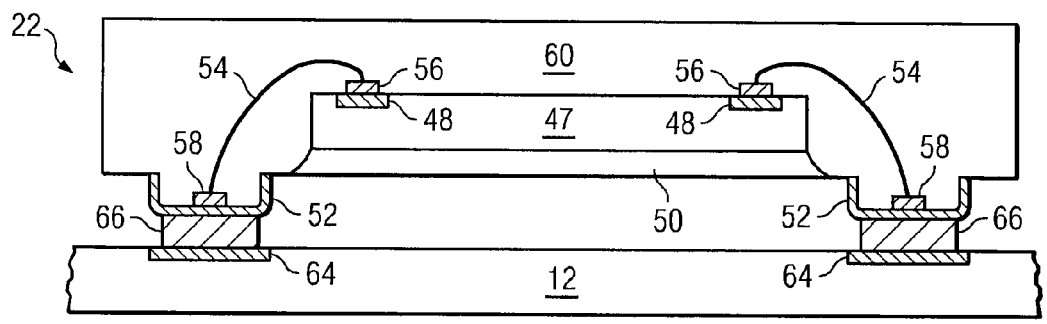

FIG. 2b illustrates further detail of BCC 22 mounted on PCB 12. Semiconductor die 47 is connected to a carrier by wire bond style first level packaging. BCC 22 is mounted to PCB 12 with a BCC style second level packaging. Semiconductor die 47 having contact pads 48 is mounted over a carrier using an underfill or epoxy-resin adhesive material 50. Semiconductor die 47 includes an active region containing analog or digital circuits implemented as active devices, passive devices, conductive layers, and dielectric layers formed within semiconductor die 47 and are electrically interconnected according to the electrical design of the die. For example, the circuit may include one or more transistors, diodes, inductors, capacitors, resistors, and other circuit elements formed within the active region of die 47. Contact pads 48 are made with a conductive material, such as Al, Cu, Sn, Ni, Au, or Ag, and are electrically connected to the circuit elements formed within die 47. Contact pads 48 are formed by PVD, CVD, electrolytic plating, or electroless plating process. Wire bonds 54 and bond pads 56 and 58 electrically connect contact pads 48 of semiconductor die 47 to contact pads 52 of BCC 22 forming the first level packaging. Molding compound or encapsulant 60 is deposited over semiconductor die 47, wire bonds 54, contact pads 48, and contact pads 52 to provide physical support and electrical isolation for the device. Contact pads 64 are formed on a surface of PCB 12 using evaporation, electrolytic plating, electroless plating, screen printing, PVD, or other suitable metal deposition process and are typically plated to prevent oxidation. Contact pads 64 electrically connect to one or more conductive signal traces 14. Solder material is deposited between contact pads 52 of BCC 22 and contact pads 64 of PCB 12. The solder material is reflowed to form bumps 66 which form a mechanical and electrical connection between BCC 22 and PCB 12.

Figure 2C:
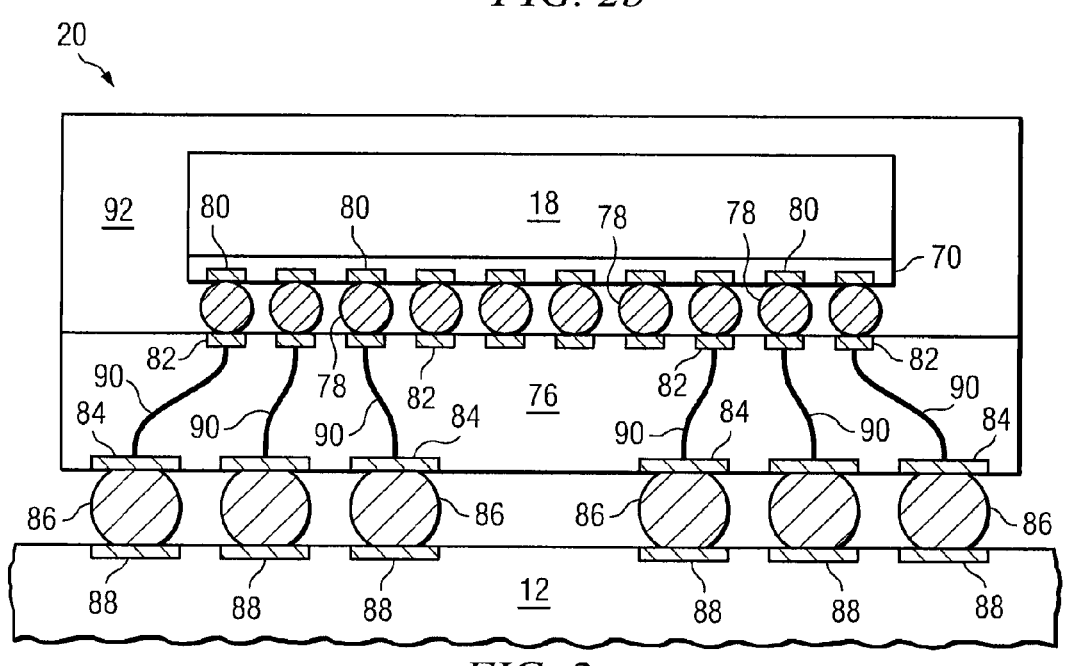

In FIG. 2c, semiconductor die 18 is mounted face down to carrier 76 with a flip chip style first level packaging. BGA 20 is attached to PCB 12 with a BGA style second level packaging. Active region 70 containing analog or digital circuits implemented as active devices, passive devices, conductive layers, and dielectric layers formed within semiconductor die 18 is electrically interconnected according to the electrical design of the die. For example, the circuit may include one or more transistors, diodes, inductors, capacitors, resistors, and other circuit elements formed within active region 70 of semiconductor die 18. Semiconductor die 18 is electrically and mechanically attached to carrier 76 through a large number of individual conductive solder bumps or balls 78. Solder bumps 78 are formed on bump pads or interconnect sites 80, which are disposed on active region 70. Bump pads 80 are made with a conductive material, such as Al, Cu, Sn, Ni, Au, or Ag, and are electrically connected to the circuit elements formed in active region 70. Bump pads 80 are formed by PVD, CVD, electrolytic plating, or electroless plating process. Solder bumps 78 are electrically and mechanically connected to contact pads or interconnect sites 82 on carrier 76 by a solder reflow process.

BGA 20 is electrically and mechanically attached to PCB 12 by a large number of individual conductive solder bumps or balls 86. The solder bumps are formed on bump pads or interconnect sites 84. The bump pads 84 are electrically connected to interconnect sites 82 through conductive lines 90 routed through carrier 76. Contact pads 88 are formed on a surface of PCB 12 using evaporation, electrolytic plating, electroless plating, screen printing, PVD, or other suitable metal deposition process and are typically plated to prevent oxidation. Contact pads 88 electrically connect to one or more conductive signal traces 14. The solder bumps 86 are electrically and mechanically connected to contact pads or bonding pads 88 on PCB 12 by a solder reflow process. Molding compound or encapsulant 92 is deposited over semiconductor die 18 and carrier 76 to provide physical support and electrical isolation for the device. The flip chip semiconductor device provides a short electrical conduction path from the active devices on semiconductor die 18 to conduction tracks on PCB 12 in order to reduce signal propagation distance, lower capacitance, and achieve overall better circuit performance. In another embodiment, the semiconductor die 18 can be mechanically and electrically attached directly to PCB 12 using flip chip style first level packaging without carrier 76.

Figure 3A:
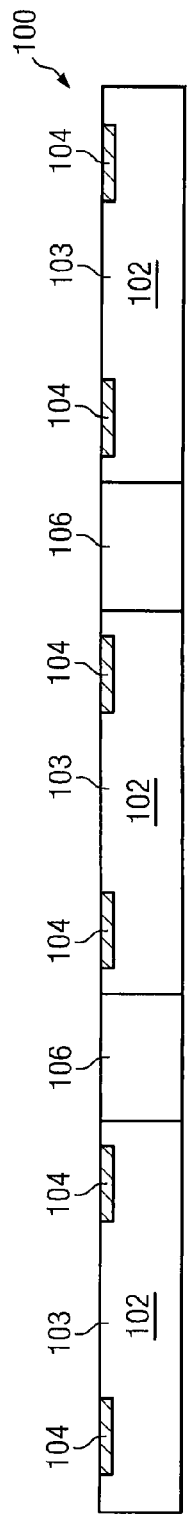
FIGS. 3a-3o illustrate a process of forming a conductive via-in-via structure in a peripheral region of a semiconductor die.
Figure 3C:
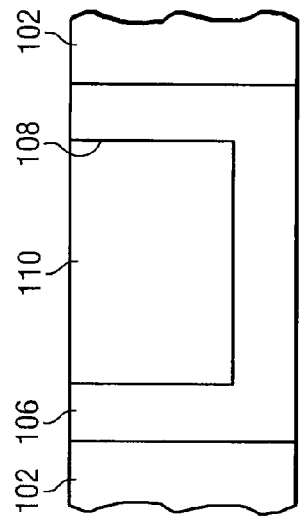
Figure 3E:
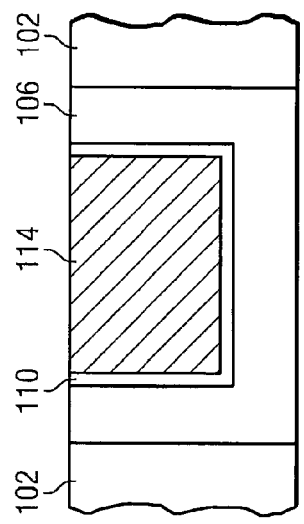
Figure 3B:
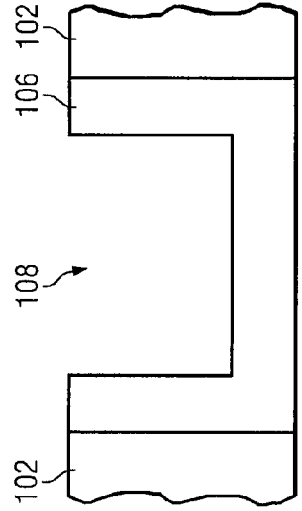
Figure 3D:
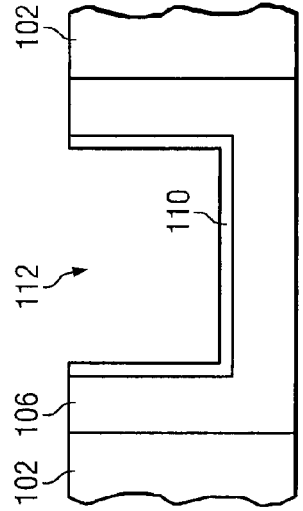
Figure 3F:
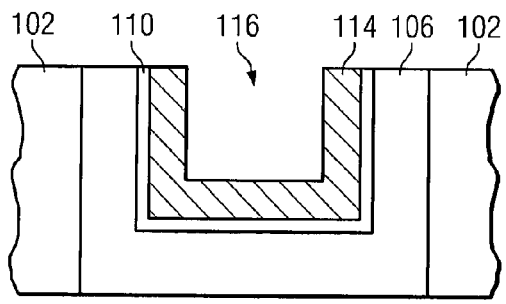
Figure 3G:
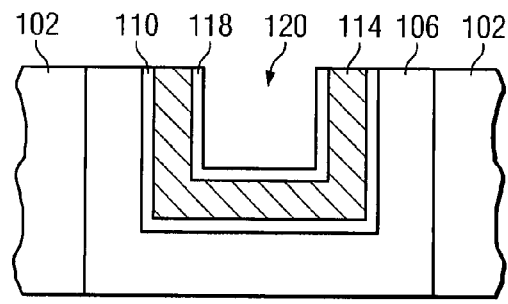
Figure 3H:
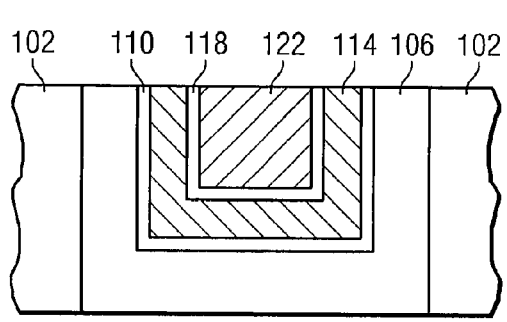
Figure 3I:
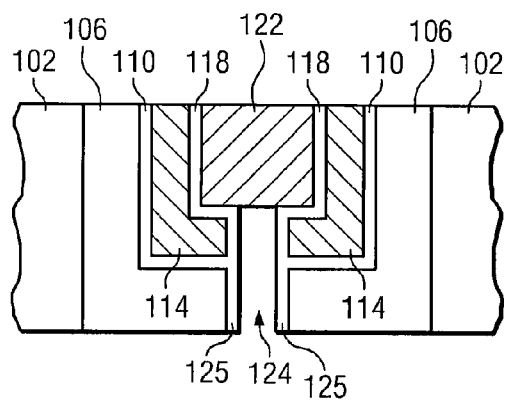
Figure 3J:
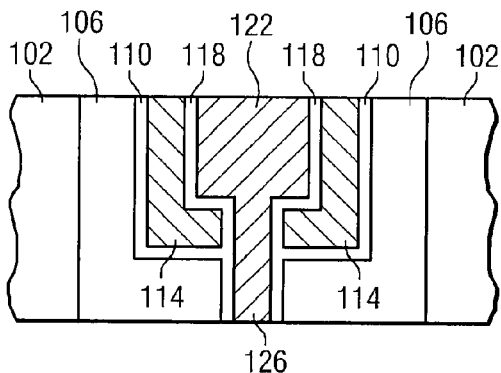
Figure 3K:
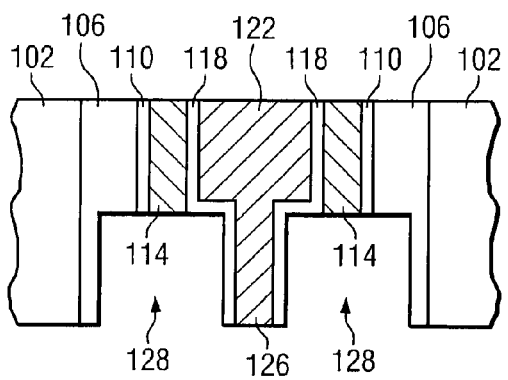
Figure 3L:
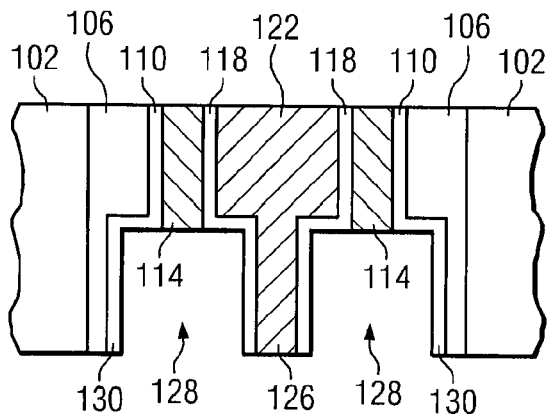
Figure 3M:
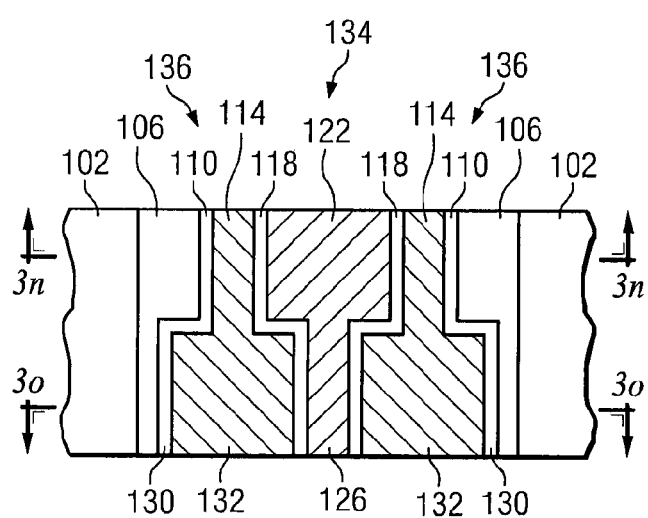
Figure 3N:
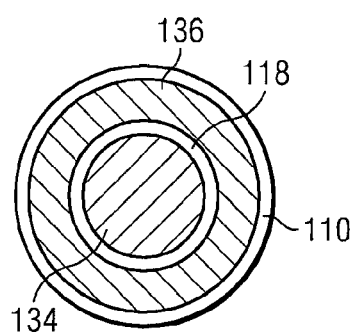
Figure 3O:
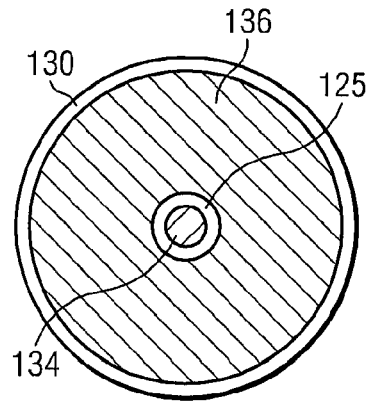

FIGS. 3a-3o illustrate a process of forming a via-in-via structure for a semiconductor device. FIG. 3a illustrates a semiconductor wafer 100 made with silicon, germanium, gallium arsenide, or other bulk semiconductor material. A plurality of semiconductor die 102 is formed on semiconductor wafer 100 using conventional integrated circuit processes, as described above. Each semiconductor die 102 has active and passive devices, integrated passive devices (IPD), conductive layers, and dielectric layers formed on top of active surface 103 according to the electrical design of the die. Semiconductor die 102 electrically connect to other devices by way of contact pads 104. A saw street or non-active peripheral region 106 is provided between semiconductor die 102 for a later singulation of wafer 100.

FIG. 3b shows further detail of saw street 106. A via 108 is formed in saw street 106 using saw blade, laser drilling, wet etching, dry etching, plasma etching, or another suitable process to selectively remove bulk semiconductor material. The walls of via 108 have a vertical or tapered geometry.

In FIG. 3c, an insulating material 110 is deposited in via 108. The insulating layer 110 can be silicon dioxide (SiO2), silicon nitride (Si3N4), silicon oxynitride (SiON), tantalum pentoxide (Ta2O5), zircon (ZrO2), aluminum oxide (Al2O3), or other material having similar insulating or dielectric properties. The insulating material 110 is deposited using PVD, CVD, printing, sintering or thermal oxidation. The insulating material 110 can be made with single or multiple layers.

In FIG. 3d, via 112 is formed in insulating material 110 using saw blade, laser drilling, wet etching, dry etching, plasma etching, or another suitable process. The walls of via 112 have a vertical or tapered geometry.

FIG. 3e shows an electrically conductive layer 114 deposited in via 112 over insulating layer 110. Conductive layer 114 can be Al, Cu, Sn, Ni, Au, Ag, or other suitable electrically conductive material. The deposition of conductive layer 114 uses PVD, CVD, electrolytic plating, or electroless plating process.

In FIG. 3f, via 116 is formed in conductive layer 114 using saw blade, laser drilling, wet etching, dry etching, plasma etching, or another suitable process. The walls of via 116 have a vertical or tapered geometry.

In FIG. 3g, an insulating material 118 is deposited in via 116. The insulating layer 118 can be SiO2, Si3N4, SiON, Ta2O5, ZrO2, Al2O3, or other material having similar insulating or dielectric properties. The insulating layer 118 is deposited using PVD, CVD, printing, sintering or thermal oxidation. The insulating layer 118 can be made with single or multiple layers. A via 120 is formed in insulating material 118 using saw blade, laser drilling, wet etching, dry etching, plasma etching, or another suitable process. The walls of via 116 have a vertical or tapered geometry.

FIG. 3h shows an electrically conductive layer 122 deposited in via 120 over insulating layer 118. Conductive layer 122 can be Al, Cu, Sn, Ni, Au, Ag, or other suitable electrically conductive material. The deposition of conductive layer 122 uses PVD, CVD, electrolytic plating, or electroless plating process.

In FIG. 3i, via 124 is formed in a backside of saw street 106, opposite the top surface of semiconductor die 102, using saw blade, laser drilling, wet etching, dry etching, plasma etching, or another suitable process. The walls of via 124 have a vertical or tapered geometry and extend to conductive layer 122.

An insulating material 125 is deposited in via 124 and interconnects with insulating material 110 and 118. The insulating material 125 can be SiO2, Si3N4, SiON, Ta2O5, ZrO2, Al2O3, or other material having similar insulating or dielectric properties. The insulating material 125 is deposited using PVD, CVD, printing, sintering or thermal oxidation.

FIG. 3j shows an electrically conductive layer 126 deposited in via 124 over insulating material 125. Conductive layer 126 electrically connects to conductive layer 122. Conductive layer 126 can be Al, Cu, Sn, Ni, Au, Ag, or other suitable electrically conductive material. The deposition of conductive layer 126 uses PVD, CVD, electrolytic plating, or electroless plating process.

In FIG. 3k, vias 128 are formed in the backside of saw street 106, opposite the top surface of semiconductor die 102, using saw blade, laser drilling, wet etching, dry etching, plasma etching, or another suitable process. The walls of vias 128 have a vertical or tapered geometry and extend to conductive layer 114.

In FIG. 3l, an insulating material 130 is deposited in vias 128, up to insulating material 110 and 118. The insulating material 130 can be SiO2, Si3N4, SiON, Ta2O5, ZrO2, Al2O3, or other material having similar insulating or dielectric properties. The insulating material 130 is deposited using PVD, CVD, printing, sintering or thermal oxidation.

FIG. 3m shows an electrically conductive layer 132 deposited in vias 128 over insulating material 130. Conductive layer 132 electrically connects to conductive layer 114. Conductive layer 132 can be Al, Cu, Sn, Ni, Au, Ag, or other suitable electrically conductive material. The deposition of conductive layer 132 uses PVD, CVD, electrolytic plating, or electroless plating process.

The conductive layers 122 and 126 constitute an inner conductive through hole via (THV) 134 in saw street 106. The conductive layers 114 and 132 constitute an outer conductive THV 136 in saw street 106. FIG. 3n shows a top view of inner conductive THV 134 and outer conductive THV 136 taken along line 3n. FIG. 3o shows a top view of inner conductive THV 134 and outer conductive THV 136 taken along line 3o. The inner conductive THV 134 and outer conductive THV 136 constitute a via-in-via structure separated by insulating material 110, 118, 125, and 130. Note that the formation of insulating material 110, 118, 125, and 130, as described in FIGS. 3a-3o, are not totally vertical but rather have horizontal and vertical sections or right-angle changes in direction (corners). For example, the formation of insulating material 110 in via 108 creates a corner. Likewise, the formation of insulating material 118 in via 116 creates another corner. The interconnection between insulating material 110, 118, and 125 creates another right angle change in direction. The corners cause inner conductive THV 134 and outer conductive THV 136 to have different diameters or cross-sectional areas between opposing surfaces of saw street 106. The cross-sectional area of inner conductive THV 134 is larger at line 3n that at line 3o. The right-angle change in direction of the insulating layers and the different cross-sectional areas of the inner and outer conductive THVs create an inter-locking via-in-via structure. The inter-locking via-in-via structure provides additional tensile strength and reduce potential of fatigue during high temperature and thermal cycling.

Figure 4A:
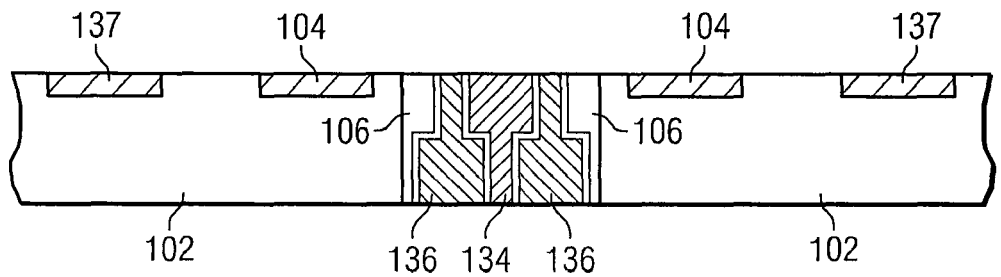
FIGS. 4a-4d illustrate electrically connecting contact pads on the semiconductor die to the conductive via-in-via structure.
Figure 4B:
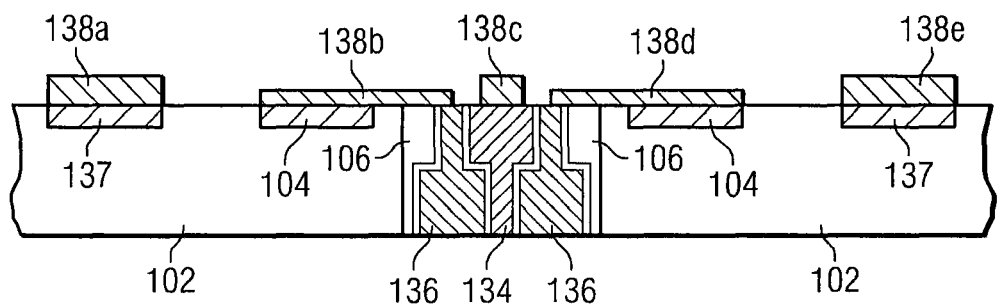

FIG. 4a shows inner conductive THV 134 and outer conductive THV 136 formed in saw street 106 between semiconductor die 102. In FIG. 4b, an electrically conductive layer 138 is formed on active surface 103 using a patterning and deposition process as individual portions or sections 138a-138e. Conductive layer 138 can be Al, Cu, Sn, Ni, Au, Ag, or other suitable electrically conductive material. The deposition of conductive layer 138 involves PVD, CVD, sputtering, evaporation, electrolytic plating, electroless plating, or other suitable metal deposition process. The individual portions of conductive layer 138 can be electrically common or electrically isolated depending on the design and function of the semiconductor device. Conductive layer 138b and 138d electrically connect contact pad 104 on semiconductor die 102 to outer conductive THV 136. Conductive layer 138a and 138e electrically connect to contact pad 137 on semiconductor die 102. Conductive layer 138c electrically connects to inner conductive THV 134. Conductive layer 138a, 138c, and 138e have greater thickness or height than conductive layer 138b and 138d. Additional deposition steps may be required to form the different heights of conductive layer 138.

Figure 4C:
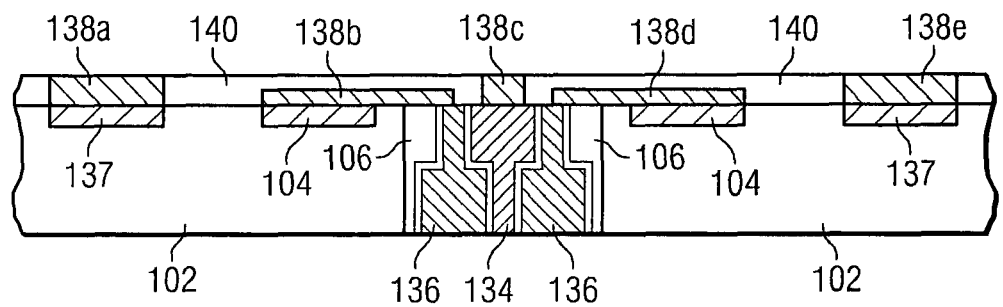

In FIG. 4c, an insulating or passivation layer 140 is formed on conductive layer 138 and active surface 103 of semiconductor die 102. The insulating layer 140 can be SiO2, Si3N4, SiON, Ta2O5, ZrO2, Al2O3, benzocyclobutene (BCB), polyimide (PI), polybenzoxazole (PBO), or other material having similar insulating and structural properties. The insulating layer 140 is deposited using PVD, CVD, spray coating, spin coating, printing, sintering or thermal oxidation. In one embodiment, insulating layer 140 is a coated polymer such as PI. The insulating layer 140 can be made with single or multiple layers.

Figure 4D:
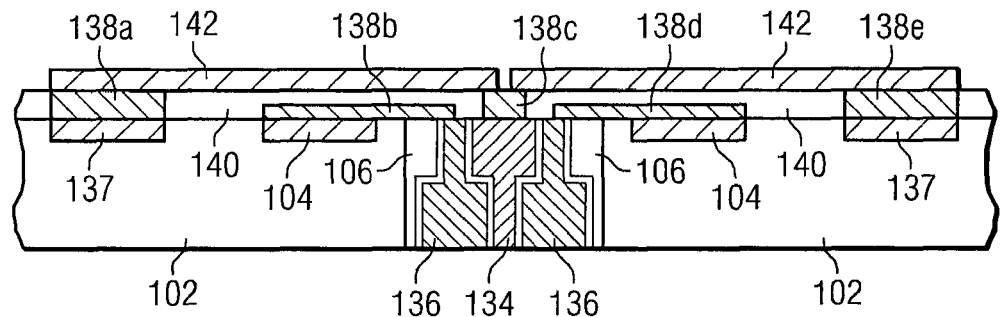

In FIG. 4d, an electrically conductive layer 142 is formed on insulating layer 140 and conductive layer 138a, 138c, and 138e using a patterning and deposition process. Conductive layer 142 can be Al, Cu, Sn, Ni, Au, Ag, or other suitable electrically conductive material. The deposition of conductive layer 142 involves PVD, CVD, sputtering, evaporation, electrolytic plating, electroless plating, or other suitable metal deposition process. Conductive layer 142 electrically connects contact pad 137 on semiconductor die 102 to inner conductive THV 134. Additional build-up structures can be formed on the top and back surfaces of the device for further functionality.

During singulation of wafer 100, the saw blade cuts through a center region of inner conductive THV 134, leaving a half conductive via-in-via structure for each semiconductor die 102.

FIG. 5 shows two side-by-side conductive via-in-via structures formed in the saw street. The semiconductor wafer containing semiconductor die 150 is mounted to an expansion table with ultraviolet (UV) tape. A saw blade or laser tool cuts through the saw street in a dicing operation. The expansion table moves in two-dimension lateral directions to expand the width of the saw street, i.e., to form a gap and create a greater physical separation between the die. The expansion table moves substantially the same distance in the x-axis and y-axis to provide equal separation around a periphery of each die. The post-expansion width of the saw street or gap ranges from 5 micrometers ($\mu$m) to 200 $\mu$m. The expanded saw street or gap defines a peripheral region around the semiconductor die.

In an alternate embodiment, the semiconductor wafer is diced to separate the semiconductor die. The individual semiconductor die are then transferred and affixed to a temporary chip carrier with an adhesive layer, e.g., thermal epoxy. The semiconductor die are placed on the chip carrier so as to have a predetermined separation gap. In general, the separation gap has sufficient width to form side-by-side conductive vias within the gap, as described below.

An organic insulating material 152 is deposited in the gap using spin coating, needle dispensing, or other suitable application process. Organic material 152 can be BCB, PI, or acrylic resin. Alternatively, other non-conductive materials such as a polymer molding compound, liquid epoxy molding, compression molding, soft laminating film, or other material having dielectric or electrical insulating properties can be deposited in the gap. The non-conductive materials can also be deposited using a transfer molding or injection molding process. Two side-by-side sets of inner conductive THV 154 and outer conductive THV 156 are formed in organic material 152 in a similar manner as described in FIGS. 3b-3o.

An electrically conductive layer 158 is formed on the active surfaces of semiconductor die 150 using a patterning and deposition process as individual portions or sections 158a-158f. Conductive layer 158 can be Al, Cu, Sn, Ni, Au, Ag, or other suitable electrically conductive material. The deposition of conductive layer 158 involves PVD, CVD, sputtering, evaporation, electrolytic plating, electroless plating, or other suitable metal deposition process. The individual portions of conductive layer 158 can be electrically common or electrically isolated depending on the design and function of the semiconductor device. Conductive layer 158b and 158e electrically connect contact pad 160 on semiconductor die 150 to outer conductive THV 156. Conductive layer 158a and 158f electrically connect to contact pad 161 on semiconductor die 150. Conductive layer 158c and 158d electrically connect to inner conductive THV 154. Conductive layer 158a, 158c, 158d, and 158f have greater thickness or height than conductive layer 158b and 158e. Additional deposition steps may be required to form the different heights of conductive layer 158.

An insulating or passivation layer 162 is formed on conductive layer 158 and the active surface of semiconductor die 150. The insulating layer 162 can be SiO2, Si3N4, SiON, Ta2O5, ZrO2, Al2O3, polyimide, BCB, PBO, or other material having similar insulating and structural properties. The insulating layer 162 is deposited using PVD, CVD, spray coating, spin coating, printing, sintering or thermal oxidation. In one embodiment, insulating layer 140 is a coated polymer such as PI. The insulating layer 162 can be made with single or multiple layers.

An electrically conductive layer 164 is formed on insulating layer 162 and conductive layer 158a, 158c, 158d, and 158f using a patterning and deposition process. Conductive layer 164 can be Al, Cu, Sn, Ni, Au, Ag, or other suitable electrically conductive material. The deposition of conductive layer 164 involves PVD, CVD, sputtering, evaporation, electrolytic plating, electroless plating, or other suitable metal deposition process. Conductive layer 164 electrically connects contact pad 161 on semiconductor die 150 to inner conductive THV 154. Additional build-up structures can be formed on the top and back surfaces of the device for further functionality.

During singulation of the wafer, the saw blade cuts through a region of organic material 152 between the side-by-side conductive THVs, leaving a full conductive via-in-via structure for each semiconductor die 150.

An alternate conductive THV 166 is shown in FIG. 6. The conductive THV 166 is formed in saw street 167 between semiconductor die 168 using a process similar to FIGS. 3b-3o. The conductive THV 166 includes inner conductive THV 170 and outer conductive THV 172. The insulating material 174 between outer conductive THV 172 and saw street 167 is vertical. The insulating material 176 between inner conductive THV 170 and outer conductive THV 172 includes horizontal and vertical sections or corners which form different cross-sectional areas in the conductive THVs between the surfaces of saw street 167. The different cross-sectional areas create an inter-locking conductive via-in-via structure which provides additional tensile strength and reduce potential of fatigue during high temperature and thermal cycling.

FIG. 7 shows conductive THV 180 formed in saw street 182 between semiconductor die 184 using a process similar to FIGS. 3b-3o. The conductive THV 180 includes inner conductive THV 186 and outer conductive THV 188. The insulating material 192 between outer conductive THV 188 and saw street 182, and insulating material 190 between inner conductive THV 186 and outer conductive THV 188, each include horizontal and vertical sections or corners which form different cross-sectional areas in the conductive THVs between the surfaces of saw street 182. The different cross-sectional areas create an inter-locking conductive via-in-via structure which provides additional tensile strength and reduce potential of fatigue during high temperature and thermal cycling.

FIG. 8 shows conductive THV 200 formed in saw street 202 between semiconductor die 204 using a process similar to FIGS. 3b-3o. The conductive THV 200 includes inner conductive THV 206, middle conductive THV 208, and outer conductive THV 210. The insulating material 212 between outer conductive THV 210 and saw street 202, and insulating material 214 between middle conductive THV 208 and outer conductive THV 210, and insulating material 216 between middle conductive THV 208 and inner conductive THV 206, each include horizontal and vertical sections or corners which form different cross-sectional areas in the conductive THVs between the surfaces of saw street 202. The different cross-sectional areas create an inter-locking conductive via-in-via structure which provides additional tensile strength and reduce potential of fatigue during high temperature and thermal cycling.

Figure 9A:
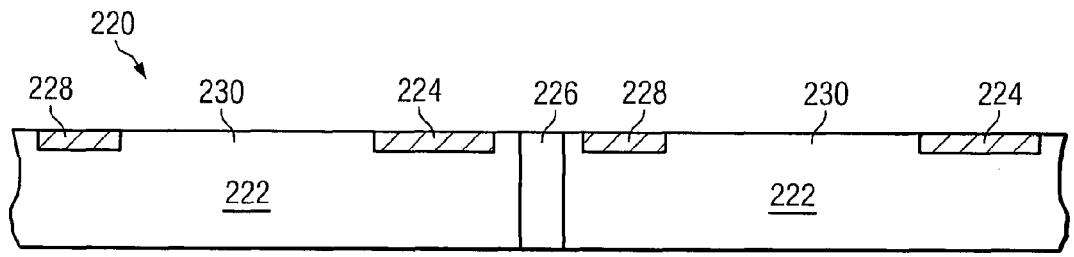
FIGS. 9a-9d illustrate a process of forming a conductive via-in-via structure in an active region of a semiconductor die.

FIGS. 9a-9d illustrate another process of forming the via-in-via structure for a semiconductor device. FIG. 9a illustrates a semiconductor wafer 220 made with silicon, germanium, gallium arsenide, or other bulk semiconductor material. A plurality of semiconductor die 222 is formed on semiconductor wafer 220 using conventional integrated circuit processes, as described above. Each semiconductor die 222 has active and passive devices, IPD, conductive layers, and dielectric layers formed on active surface 230 according to the electrical design of the die. Semiconductor die 222 electrically connects to other devices by way of contact pads 224 and 228. A saw street or non-active peripheral region 226 is provided between semiconductor die 222 for a later singulation of wafer 220.

Figure 9B:
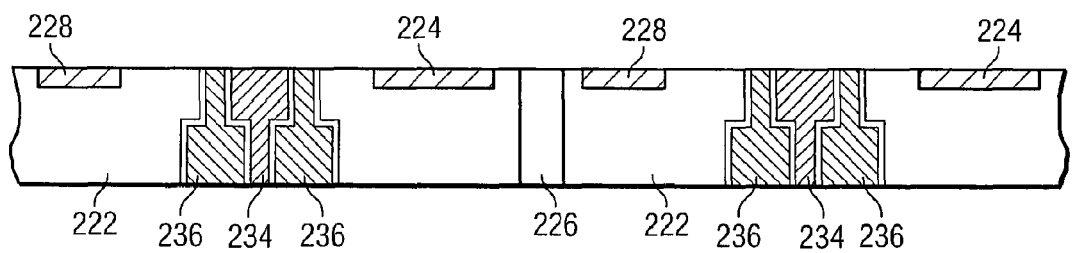

FIG. 9b shows inner conductive through silicon via (TSV) 234 and outer conductive TSV 236 formed in an active region of semiconductor die 222 using a process similar to FIGS. 3b-3o. The inner conductive TSV 234 and outer conductive TSV 236 are useful for high density applications.

Figure 9C:
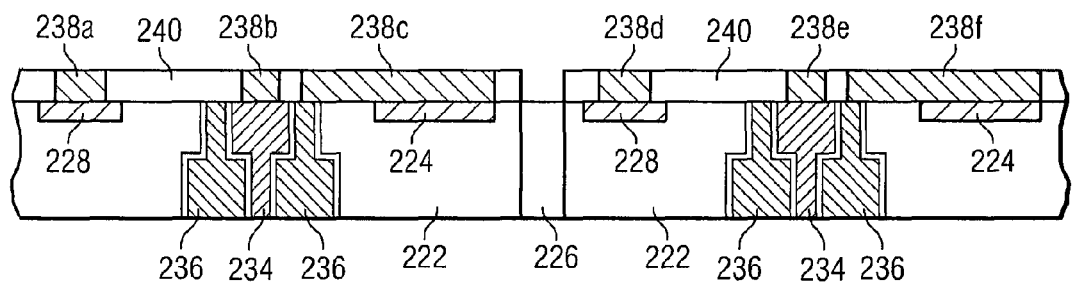

In FIG. 9c, an electrically conductive layer 238 is formed on active surface 230 using a patterning and deposition process as individual portions or sections 238a-238f. Conductive layer 238 can be Al, Cu, Sn, Ni, Au, Ag, or other suitable electrically conductive material. The deposition of conductive layer 238 involves PVD, CVD, sputtering, evaporation, electrolytic plating, electroless plating, or other suitable metal deposition process. The individual portions of conductive layer 238 can be electrically common or electrically isolated depending on the design and function of the semiconductor device. Conductive layer 238c and 238f electrically connect contact pad 224 on semiconductor die 222 to outer conductive THV 236. Conductive layer 238a and 238d electrically connect to contact pad 228 on semiconductor die 222. Conductive layer 238b and 238e electrically connects to inner conductive THV 234.

An insulating or passivation layer 240 is formed on active surface 230 between conductive layer 238. The insulating layer 240 can be SiO2, Si3N4, SiON, Ta2O5, ZrO2, Al2O3, BCB, PI, PBO, or other material having similar insulating and structural properties. The insulating layer 240 is deposited using PVD, CVD, spray coating, spin coating, printing, sintering or thermal oxidation. In one embodiment, insulating layer 240 is a coated polymer such as PI. The insulating layer 240 can be made with single or multiple layers.

Figure 9D:
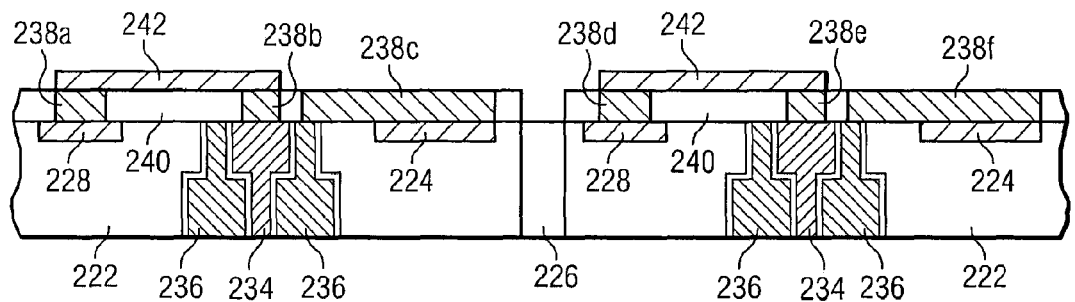

In FIG. 9d, an electrically conductive layer 242 is formed on insulating layer 240 and conductive layer 238a, 238b, 238d, and 238e using a patterning and deposition process. Conductive layer 242 can be Al, Cu, Sn, Ni, Au, Ag, or other suitable electrically conductive material. The deposition of conductive layer 242 involves PVD, CVD, sputtering, evaporation, electrolytic plating, electroless plating, or other suitable metal deposition process. Conductive layer 242 electrically connects contact pad 228 on semiconductor die 222 to inner conductive THV 234. Additional build-up structures can be formed on the top and back surfaces of the device for further functionality.

During singulation of wafer 220, the saw blade cuts through the saw street 226, leaving a full conductive via-in-via structure for each semiconductor die 222.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
  a semiconductor wafer including a plurality of semiconductor die formed in the semiconductor wafer; and
  a via-in-via structure formed in a non-active region of the semiconductor wafer between the semiconductor die and including,
    (a) an inner conductive via,
    (b) an outer conductive via formed around the inner conductive via, and
    (c) an insulating material disposed between the inner conductive via and outer conductive via.

2. The semiconductor device of claim 1, wherein a first cross-sectional area of the inner conductive via proximate to a first surface of the semiconductor wafer is different from a second cross-sectional area of the inner conductive via proximate to a second surface of the semiconductor wafer opposite the first surface of the semiconductor wafer.

3. The semiconductor device of claim 1, wherein a first cross-sectional area of the outer conductive via proximate to a first surface of the semiconductor wafer is different from a second cross-sectional area of the outer conductive via proximate to a second surface of the semiconductor wafer opposite the first surface of the semiconductor wafer.

4. The semiconductor device of claim 1, wherein the inner conductive via includes:
  a first conductive via formed partially through a first surface of the semiconductor wafer and including a first diameter; and
  a second conductive via formed partially through a second surface of the semiconductor wafer opposite the first surface of the semiconductor wafer and including a second diameter different from the first diameter.

5. The semiconductor device of claim 1, wherein a portion of the outer conductive via laterally overlaps a portion of the inner conductive via to form an inter-locking via-in-via structure.

6. The semiconductor device of claim 1, further including a middle conductive via formed between the inner conductive via and outer conductive via.

7. A semiconductor device, comprising:
a semiconductor die; and
a via-in-via structure formed in a peripheral region of the semiconductor die and including,
(a) a first conductive via,
(b) an insulating material formed around the first conductive via, and
(c) a second conductive via formed around the insulating material.

8. The semiconductor device of claim 7, wherein the first conductive via includes vertical and lateral sidewalls.

9. The semiconductor device of claim 7, wherein a cross-sectional area of the first conductive via proximate to a first surface of the peripheral region is different from a cross-sectional area of the first conductive via proximate to a second surface of the peripheral region opposite the first surface of the peripheral region.

10. The semiconductor device of claim 7, wherein a cross-sectional area of the second conductive via proximate to a first surface of the peripheral region is different from a cross-sectional area of the second conductive via proximate to a second surface of the peripheral region opposite the first surface of the peripheral region.

11. The semiconductor device of claim 7, wherein the first conductive via laterally overlaps the second conductive via.

12. The semiconductor device of claim 7, further including a third conductive via formed around the second conductive via.

13. The semiconductor device of claim 7, further including a conductive layer formed over the semiconductor die and including a first portion electrically coupled to the first conductive via and a second portion electrically coupled to the second conductive via.

14. A semiconductor device, comprising:
a substrate; and
a via-in-via structure formed through the substrate, the via-in-via structure including,
(a) a first conductive via extending from a first surface of the substrate to a second surface of the substrate opposite the first surface,
(b) a second conductive via formed around the first conductive via and extending from the first surface of the substrate to the second surface of the substrate, and
(c) an insulating material disposed between the first conductive via and second conductive via.

15. The semiconductor device of claim 14, wherein the first conductive via includes vertical and lateral sidewalls.

16. The semiconductor device of claim 14, wherein a first cross-sectional area of the first conductive via at the first surface of the substrate is different from a second cross-sectional area of the first conductive via at the second surface of the substrate.

17. The semiconductor device of claim 14, wherein a first cross-sectional area of the second conductive via at the first surface of the substrate is different from a second cross-sectional area of the second conductive via at the second surface of the substrate.

18. The semiconductor device of claim 14, wherein the first conductive via laterally overlaps the second conductive via.

19. The semiconductor device of claim 14, wherein the via-in-via structure further includes a third conductive via formed between the first conductive via and second conductive via.

20. The semiconductor device of claim 14, further including a conductive layer formed over the substrate and including a first portion electrically coupled to the first conductive via and a second portion electrically coupled to the second conductive via.

21. A semiconductor device, comprising:
a substrate; and
a via-in-via structure formed through the substrate, the via-in-via structure including,
(a) a first conductive via,
(b) an insulating material formed around the first conductive via, and
(c) a second conductive via formed around the insulating material.

22. The semiconductor device of claim 21, wherein the substrate includes a semiconductor die and the first conductive via and second conductive via are formed through the semiconductor die.

23. The semiconductor device of claim 21, wherein the substrate includes a plurality of semiconductor die and the first conductive via and second conductive via are formed between the semiconductor die.

24. The semiconductor device of claim 21, wherein the via-in-via structure further includes a third conductive via formed between the first conductive via and second conductive via.

25. The semiconductor device of claim 21, further including a conductive layer formed over the substrate and electrically coupled to the first conductive via or second conductive via.

26. The semiconductor device of claim 21, wherein a first cross-sectional area of the first conductive via is different from a second cross-sectional area of the first conductive via.

27. The semiconductor device of claim 21, wherein a first cross-sectional area of the second conductive via is different from a second cross-sectional area of the second conductive via.

28. The semiconductor device of claim 21, wherein the first conductive via laterally overlaps the second conductive via.

29. The semiconductor device of claim 1, wherein the inner conductive via and outer conductive via extend from a first surface of the semiconductor wafer to a second surface of the semiconductor wafer opposite the first surface of the semiconductor wafer.

30. The semiconductor device of claim 14, wherein the substrate includes a semiconductor die.

* * * * *